United States Patent [19]

Machida

[11] 4,404,517
[45] Sep. 13, 1983

[54] IMPEDANCE MEASURING DEVICE

[76] Inventor: Kenji Machida, 2-3-3, Nishiogiminami, Suginami-ku, Tokyo, Japan

[21] Appl. No.: 194,604

[22] Filed: Oct. 6, 1980

[30] Foreign Application Priority Data

Oct. 9, 1979 [JP] Japan .................. 54-130177

[51] Int. Cl.³ ............................ G01R 27/00
[52] U.S. Cl. ................ 324/57 R; 324/60 R
[58] Field of Search .............. 324/57 R–60 R

[56] References Cited

U.S. PATENT DOCUMENTS

| | | | |
|---|---|---|---|
| 2,595,675 | 5/1952 | Jaynes | 324/57 R |
| 2,604,511 | 7/1952 | Marzolf | 324/57 R |
| 2,940,037 | 6/1960 | Lide | 324/60 R |
| 3,530,379 | 9/1970 | Demerliac | 324/60 R |
| 3,786,349 | 1/1974 | Devenyi | 324/57 R |
| 3,947,760 | 3/1976 | Noguchi | 324/57 R |

FOREIGN PATENT DOCUMENTS 1541413 2/1979 United Kingdom ............ 324/57 R

OTHER PUBLICATIONS

Kameoka: "Measuring High-Value Capacitors"–hp Journal–3/72.
Maeda: ". . . 1 MHZ Digital LCR Meter"–hp Journal–3/74.
Avinor: "Measurements of L & C Over Nine Decodes'-'–Journal of Phys. & Sci. Instruments–Aug. 1977.
Maeda: "Multifreq. LCR Mtn . . . "–hp Journal–2/79.

Primary Examiner—Stanley T. Krawczewicz
Assistant Examiner—Jose M. Solis
Attorney, Agent, or Firm—Cushman, Darby & Cushman

[57] ABSTRACT

An impedance measuring device having a signal source (10) for providing a first signal (e1) having a given frequency, a given amplitude and a given waveform; a differentiation circuit (14) which includes an unknown impedance element, for differentiating the first signal and providing a second signal (e3); and a peak voltmeter (12) for measuring the unknown impedance element whose impedance value is proportional to an amplitude of the second signal and is displayed by the peak voltmeter.

12 Claims, 16 Drawing Figures

IMPEDANCE MEASURING DEVICE

BACKGROUND OF THE INVENTION

This invention relates to an impedance measuring device, especially applied to a capacitance measurement of a digital multimeter.

For a capacitance measuring device of digital multimeter, the following measurement method has been proposed. This device comprises a CR differentiation circuit for differentiating a squarewave signal and providing a differentiated pulse, and a voltmeter circuit for measuring and displaying a capacitance value in accordance with the average voltage level of the differentiated pulse. The basic principle of this measurement method may be considered as follows. Now suppose that the amplitude of an input squarewave signal is Ei, the period thereof is T and the average voltage level of a differentiated pulse obtained from the CR differentiation circuit is $L_{ave}$. Then, the following expression is applicable:

$$L_{ave} = \frac{1}{T} \int_0^T Ei \exp\left(-\frac{t}{CR}\right) dt \qquad (1A)$$

$$= -\frac{CR}{T} Ei \left\{ \exp\left(-\frac{T}{CR}\right) - 1 \right\}$$

where t denotes a time. In equation (1A), assume that $$\left. \begin{array}{c} \exp(-T/CR) << 1 \\ \text{or} \\ CR << T \end{array} \right\} \qquad (2A)$$

From the assumption or approximation of equation (2A), equation (1A) can be simplified as:

$$L_{ave} \approx \frac{CR}{T} Ei \qquad (3A)$$

In equation (3A), when the parameters, T, Ei and R have known constant values, the average level $L_{ave}$ can be regarded as proportional to the capacitance C.

Here realization of assumption (2A) is required for establishing the proportional or linear relation between $L_{ave}$ and C. This requires that the pulse area of the differentiated pulse be extremely small, or voltage magnitude of $L_{ave}$ be little, in comparison with the input squarewave signal. By the measurement method based on equation (1A) therefore a very high-sensitivity voltmeter, generally a DC voltmeter, must be used. For this reason, a digital multimeter being applied with the above-mentioned measuring method is liable to be affected by DC-level variation occurring at the time of measuring range change. Thus, a zero-adjust operation is required by the user when a capacitance measuring is performed.

SUMMARY OF THE INVENTION

The object of the present invention is to provide an improved impedance measuring device.

To achieve the above object, an impedance measuring device according to this invention comprises a signal source for providing a first signal having a given frequency, a given amplitude and a given waveform; a differentiation circuit for differentiating the first signal and providing a differentiated second signal, the differentiation circuit including an unknown impedance element; and a measurement circuit connected to the differentiation circuit for measuring the unknown impedance element whose impedance value is proportional to an amplitude of the second signal and is displayed by a display device adopted to the measurement circuit in accordance with an amplitude of the second signal.

When the first signal having a triangle waveform is supplied to the differentiation circuit, the second signal or a differentiated output is a squarewave signal with 50% duty cycle. The amplitude or the peak level of the second signal is proportional to the time constant of the differentiation circuit and its amplitude is relatively large. Since the differentiated second signal has a large level, sensitivity of the measurement circuit for measuring the unknown impedance may be low. In other words, a voltmeter connected to the differentiation circuit does not require an excessive high sensitivity. From this, a zero-adjustment at the time of measuring range change or a zero-adjustment for compensating a DC-drift of the voltmeter can be omitted. Especially, when the differentiated second signal is a symmetrical wave such as squarewave or a sinewave, the voltmeter may be an AC type. In this case, DC-drift of the voltmeter can practically be neglected.

DETAILED DESCRIPTION OF THE PREFERRED EMBODIMENT

Before proceeding with the description of the embodiment of the invention, it will expressly be understood that like reference symbols are used to designate like portions throughout the drawings for simplicity of illustration and that the components designated by like reference symbols may easily be replaced with each other or one another with minor change thereof by a skilled person in the art. An embodiment of an impedance measuring device according to the invention will be described. In the description to follow, like or similar portions are designated by like or similar symbols for simplicity.

Figure 1:
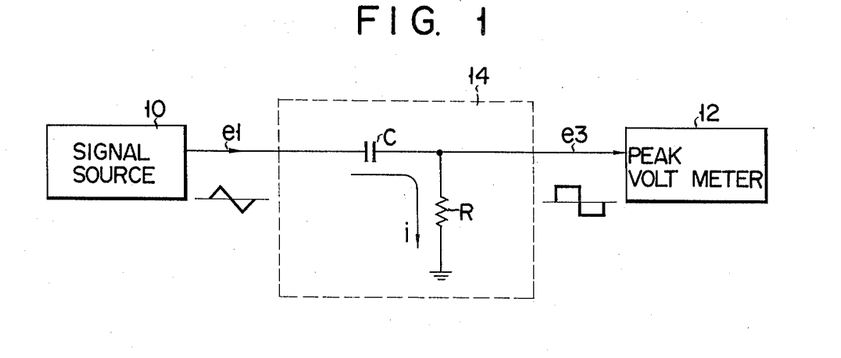
FIG. 1 shows a basic configuration of an impedance measuring device according to the present invention.

FIG. 1 shows a basic configuration of an impedance measuring device of the present invention. A signal source 10 provides a first signal e1 with low output impedance. The signal e1, e.g. a trianglewave signal, is supplied to a peak voltmeter 12 through a differentiation circuit 14. The circuit 14 consists of a capacitor C and a resistor R. Here suppose that the input impedance of the voltmeter 12 is infinite, the current flowing through the capacitor C is i and a second signal appearing at the junction point of the capacitor C and the resistor R is e3. Then, the following equations are obtained.

$$e1 - e3 = \frac{1}{C} \int i \, dt \quad (1)$$

$$i = \frac{e3}{R} \quad (2)$$

Here t denotes a time. Substituting equation (2) into equation (1):

$$e1 - e3 = \frac{1}{CR} \int e3 \, dt \quad (3)$$

Differentiating equation (3), the following differential equation is established.

$$\frac{d}{dt} e1 - \frac{d}{dt} e3 = \frac{1}{CR} e3 \quad (4)$$

A typical solutions for equation (4) are $$e1 = at + b \quad (5)$$

$$e3 = K \quad (6)$$

here parameters a, b and K are constant. The parameter a denotes a slope of the signal e1, b a DC component of the signal e1 and K an amplitude (peak voltage) of the signal e3. Substituting equations (5) and (6) into equation (4), the following result is yielded.

$$a = \frac{1}{CR} K \quad (7)$$

Equation (7) can be arranged as follows.

$$C = \frac{1}{aR} K \quad (8)$$

Equation (8) indicates that the capacitance C is proportional to an amplitude of the signal e3, or a peak voltage K.

Other approximate solutions for equation (4) are $$e1 = x \exp(j\omega) \quad (9)$$

$$e3 = y \exp j(\omega t - \phi) \quad (10)$$

here parameters x, y, ω are constant and a parameter φ is variable. The parameter x denotes an amplitude of the signal e1, y an amplitude of the signal e3, ω an angular frequency of the signal e1 and φ a phase-shift angle. Substituting equations (9) and (10) into equation (4):

$$j\omega x \exp(j\omega t) - j\omega y \exp j(\omega t - \phi) = \frac{1}{CR} y \exp j(\omega t - \phi) \quad (11)$$

Dividing the terms of equation (11) by exp j(ωt−φ):

$$j\omega x \exp(j\phi) - j\omega y = \frac{1}{CR} y \quad (12)$$

Equation (12) can be arranged as follows:

$$C = \frac{1}{j\omega R} \cdot \frac{1}{x \exp(j\phi) - y} y \quad (13)$$

In this equation, if x exp (jφ)>>y, equation (13) can be simplified as follows:

$$C \approx \frac{1}{j\omega R} \cdot \frac{1}{X \exp(j\phi)} y \quad (14)$$

Here, the absolute value of exp (jφ) can be regarded as a constant, and parameters ω, R and x are constant, the capacitance C therefore is nearly proportional to the amplitude y of the signal e3.

Figure 2:
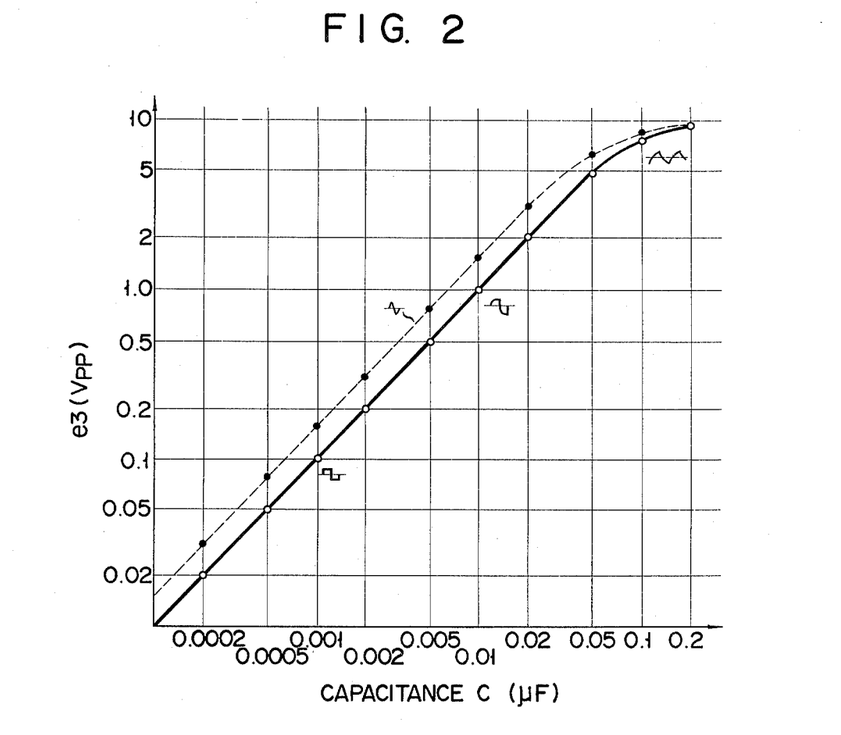
FIG. 2 is an experimental data on the configuration of FIG. 1, showing the relation between a capacitance of C and an amplitude of e3.

FIG. 2 shows experimental data on the configuration of FIG. 1. The measuring conditions of FIG. 2 are as follows.

(i) In the case where the signal e1 is a trianglewave signal (a solid line curve):
  amplitude of the signal e1=10 $V_{PP}$
  frequency of the signal e1=250 Hz
  resistance of the resistor R=10 kΩ

(ii) In the case where the signal e1 is a sinewave signal (a broken line curve):
  conditions being identical with those of the above case (i).

FIG. 2 indicates that, in the case of (i) the capacitance measuring range below 0.02 μF is almost linear, while in the case of (ii) the measuring range below 0.01 μF is almost linear. That is, the linearity between a capacitance C and an amplitude of the signal e3 according to the case (i) is better than that of the case (ii).

Figure 3:
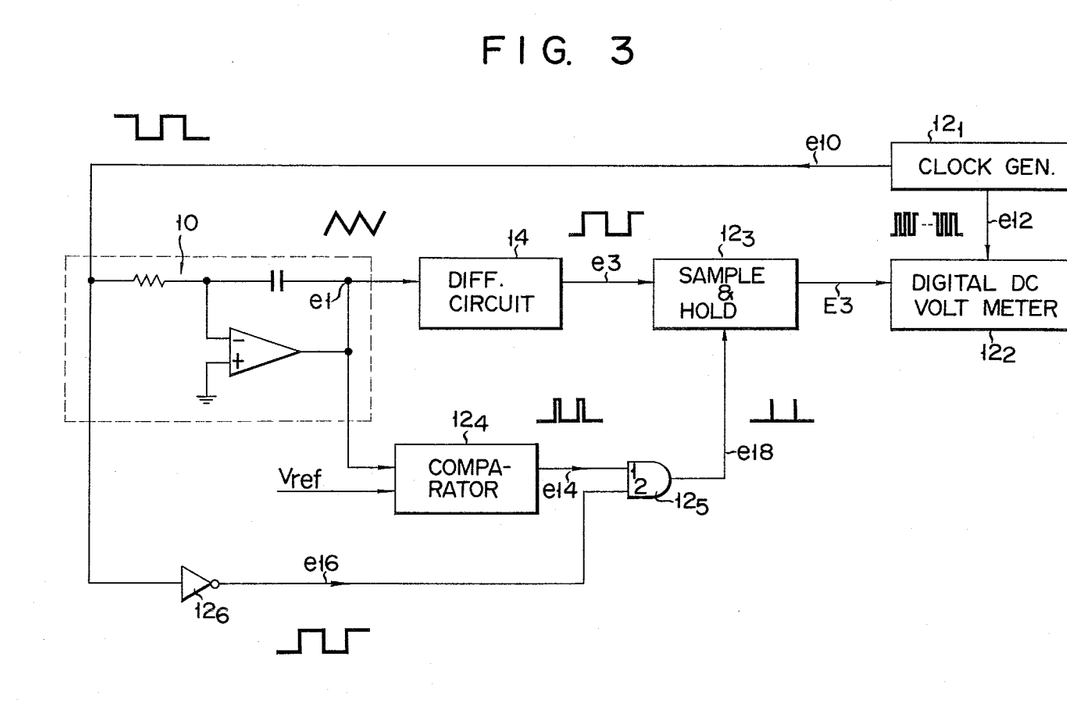
FIG. 3 shows a detailed configuration of FIG. 1.
Figure 4A:
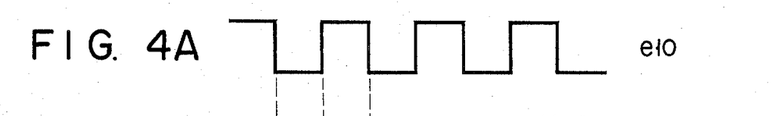
FIGS. 4A to 4G show a timing chart for explaining the operation of FIG. 3.
Figure 4B:
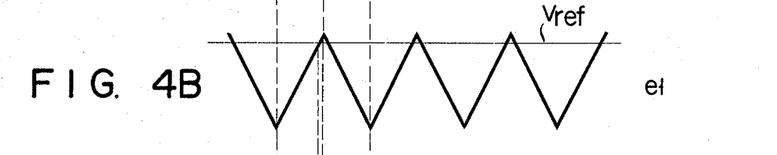
Figure 4C:
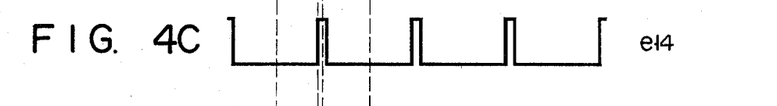
Figure 4D:
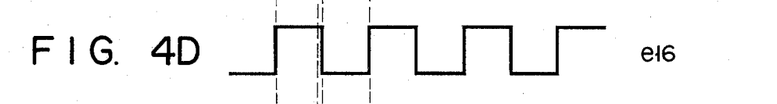
Figure 4E:
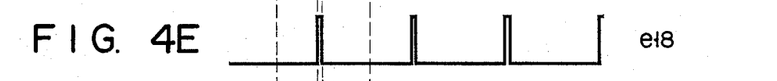
Figure 4F:
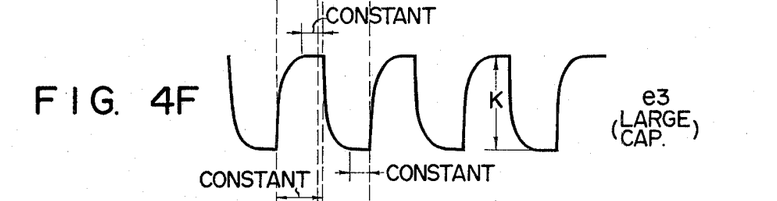
Figure 4G:
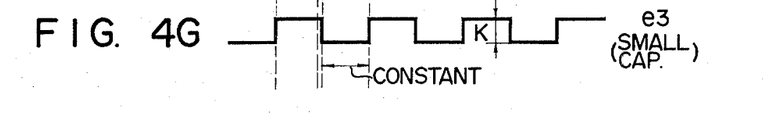

FIG. 3 shows a detailed configuration of FIG. 1. FIGS. 4A to 4G show a timing chart useful explaining the operation of the configuration of FIG. 3. A clock generator 12, generates an LF pulse e10 and an HF pulse e12. The pulse e10 is a squarewave with 50% duty cycle as shown in FIG. 4A and is used for producing a first signal e1. The pulse e12 is used for clocking a digital DC voltmeter $12_2$. The voltmeter $12_2$ may be a conventional dual slope integration type. The pulse e10 is converted into the signal e1 having triangle waveform by a Miller integrator 10. The signal e1 is converted into a second signal e3 through a differentiation circuit 14. The signal e3, as shown in FIG. 4F or 4G, is inputted to a sample/hold circuit $12_3$. The signal e1 is applied to a comparator $12_4$. The comparator $12_4$ compares the voltage potential of signal e1 with a reference voltage potential $V_{ref}$. The comparator $12_4$ produces a comparison pulse e14 when the potential of signal e1 exceeds $V_{ref}$ as shown in FIGS. 4B and 4C. The pulse e14 is inputted to the first input of an AND gate $12_5$. The second input of the gate $12_5$ is supplied with a gating pulse e16. The pulse e16 is obtained from an inverter $12_6$. The inverter $12_6$ inverts the pulse e10 and provides the pulse e16 as shown in FIGS. 4A and 4D. The gate $12_5$ provides a sampling pulse e18 to the circuit $12_3$. Thus, the circuit $12_3$ samples a voltage potential at the tail part of signal e3 as shown in FIG. 4E and FIG. 4F (or 4G). This sampling operation may be carried out at the falling and rising edges of signal e3. The circuit $12_3$ provides a sampled signal E3 to the voltmeter $12_2$. The signal E3 is a DC signal representing an amplitude or a peak voltage of the signal e3. The DC potential of signal E3 is measured and displayed by the voltmeter $12_2$.

Figure 5:
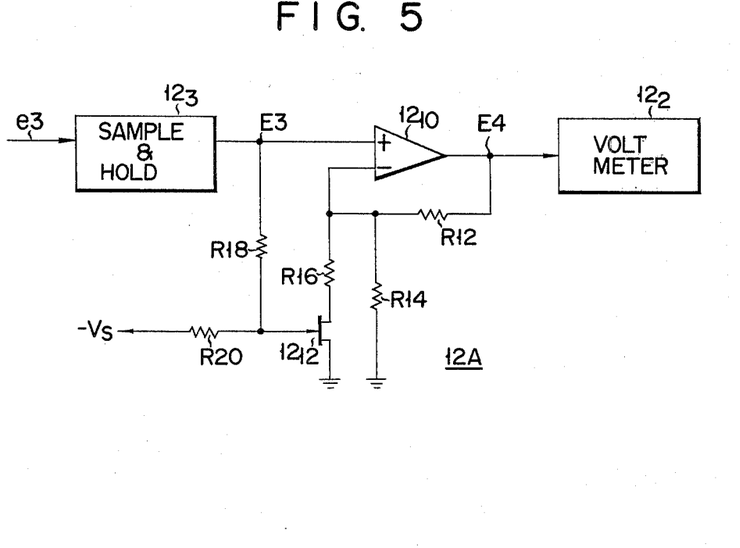
FIG. 5 shows a compensation circuit for compensating a non-linearity as shown in FIG. 2.

FIG. 5 shows a compensation circuit 12A for compensating a non-linearity as shown in FIG. 2. As seen from FIG. 2 the relation between the peak voltage of e3 and the capacitance of C is non-linear within the range over 0.02 μF, when the signal e1 is a trianglewave. The circuit 12A can compensate such non-linearity so that the linear range is expanded. The sampled DC signal E3 is inputted to the non-inverted input of an amplifier $12_{10}$. The output of amplifier $12_{10}$ is connected through a resistor R12 to the inverted input thereof. The inverted input is grounded via a resistor R14. Connected parallel to the resistor R14 are a resistor R16 and the drain-source path of an N channel FET $12_{12}$. The gate of FET $12_{12}$ is provided with the signal E3 through a resistor R18 and connected to a fixed negative potential $-V_s$ through a resistor R20. When the potential of signal E3 is smaller than a predetermined potential $P_x$ corresponding to C=0.02 μF of the solid line shown in FIG. 2, the FET $12_{12}$ is in a cut-off state. In this case a gain G1 of the circuit 12A is $$G1 = 1 + \frac{R12}{R14} \quad (15)$$

While the potential of signal E3 is larger than the predetermined potential $P_x$, the FET $12_{12}$ becomes conductive. In this case a gain G2 of the circuit 12A is $$G2 = 1 + \frac{R12}{R14//(R16 + R12_{12})} \quad (16)$$

where $R12_{12}$ denotes the inner resistance of FET $12_{12}$. Since $R14//(R16+R12_{12}) < R14$, gain G2 is larger than gain G1. The resistance $R12_{12}$ is decreased as an increase of the signal E3 potential. Hence, from equation (16), the gain G2 is increased accompanied by the increase of signal E3 or e3.

Figure 6:
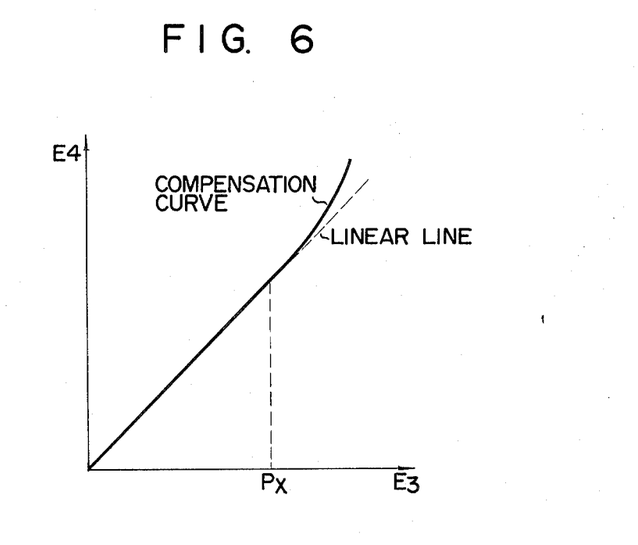
FIG. 6 illustrates a compensation characteristic or a relation between the signals E3 and E4 shown in FIG. 5.

The amplifier $12_{10}$ outputs a compensated signal E4 of which DC potential corresponds to E3G2. FIG. 6 shows the relation between the signals E3 and E4. When the potential of signal E3 is below the predetermined potential $P_x$, the relation is linear and E4=E3G1. While the potential of signal E3 is over the potential $P_x$, the relation is non-linear and E4=E3G2. The non-linear curve or a compensation curve of the circuit 12A depends on the characteristic of FET $12_{12}$, the potential $-V_s$ and the resistors R12 to R20. Another active device may be used for the variable resistance $12_{12}$. The circuit 12A can also compensate a non-linearity when a sinewave or another waveform signal is used for the first signal e1.

Figure 7:
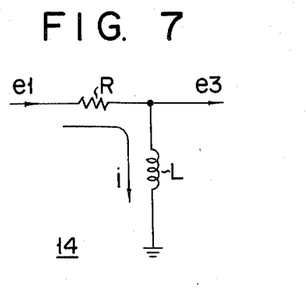
FIG. 7 shows a modification of the differentiation circuit shown in FIG. 1.

FIG. 7 shows a modification of the differentiation circuit 14. The circuit 14 of FIG. 7 may be applied for measuring an inductance. From FIG. 7 configuration, following equations are obtained.

$$e3 = L \frac{d}{dt} i \quad (17)$$

$$i = \frac{e1 - e3}{R} \quad (18)$$

Here L denotes an inductance of the inductor. Substituting equation (18) into equation (17):

$$e3 = \frac{L}{R} \left( \frac{d}{dt} e1 - \frac{d}{dt} e3 \right) \quad (19)$$

Aforementioned equations (5), (6) or (9), (10) also satisfy equation (19). Hereinafter, discussion will be made by using equations (5) and (6) as solutions of equation (19). Substituting equations (5) and (6) into equation (19), following result is yielded.

$$K = \frac{L}{R} a \quad (20)$$

Equation (20) can be arranged as follows.

$$L = \frac{R}{a} K \quad (21)$$

Equation (21) indicates that the inductance L is proportional to an amplitude of the signal e3, or a peak voltage K.

Figure 8:
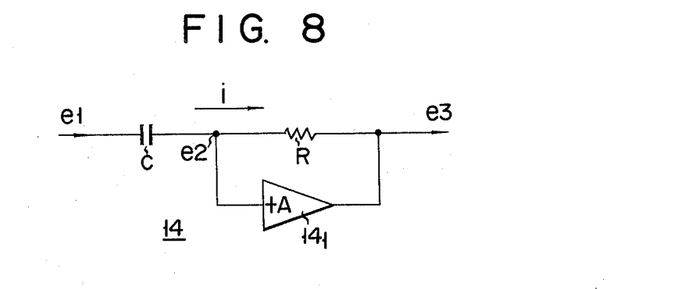
FIG. 8 shows another modification of the differentiation circuit shown in FIG. 1.

FIG. 8 shows another modification of the differentiation circuit 14. The circuit 14 of FIG. 8 may be applied for measuring a capacitance. From FIG. 8 configuration, following equations are obtained.

$$i = \frac{e2 - e3}{R} \quad (22)$$

$$e2 = \frac{e3}{A} \quad (23)$$

$$e1 - e2 = \frac{1}{C} \int i \, dt \quad (24)$$

Here A denotes the amplification degree (constant) of a positive-phase amplifier $14_1$, e2 an input signal of the amplifier $14_1$. The input impedance of the amplifier $14_1$ is regarded as infinite. Equations (22) through (24) yield $$e1 - \frac{1}{A} e3 = \frac{1}{CR} \int \frac{1-A}{A} e3 \, dt \quad (25)$$

Differentiating equation (25), following differential equation is established.

$$\frac{d}{dt} e1 - \frac{d}{dt} \left( \frac{1}{A} e3 \right) = \frac{1}{CR} \frac{1-A}{A} e3 \quad (26)$$

Aforementioned equations (5), (6) or (9), (10) also satisfy equation (26). Hereinafter, consideration will be given to equations (5) and (6) for brevity. Substituting equations (5) and (6) into equation (26), following result is obtained.

$$a = \frac{1}{CR} \frac{1-A}{A} K \quad (27)$$

Equation (27) can be arranged as follows.

$$C = \frac{1}{aR} \frac{1-A}{A} K \quad (28)$$

Equation (28) indicates that the capacitance C is proportional to an amplitude K of the signal e3. Equation (28) should be compared with aforementioned equation (8). When the parameters C, a and R are the same in the equations (8) and (28), and if (1-A)/A is more than half and less than one, the amplitude K of equation (28) is larger than that of quation (8). For example, suppose that C=0.001 μF
a=10 kV/sec (=10 V/ms)
R=10 kΩ
A=0.9

Applying above parameters to equation (8), $$0.001\mu = \frac{1}{10k \times 10k} K$$

thus, $$K=0.001\mu \times 10k \times 10k = 0.1 \text{ (volt)} \quad (29)$$

While applying the parameters to equation (28), $$0.001\mu = \frac{1}{10k \times 10k} \frac{0.1}{0.9} K \quad (30)$$

thus, $$K = 0.001\mu \times 10k \times 10k \times \frac{0.9}{0.1} = 0.9 \text{ (volt)}$$

As seen from resolutions (29) and (30), if $$\left.\begin{array}{c} \frac{1-A}{A} < 1 \\ \text{or} \\ 0.5 < A < 1 \end{array}\right\} \quad (31)$$

is established, a signal e3 having relatively large amplitude K can be obtained from the configuration of FIG. 8.

Figure 9:
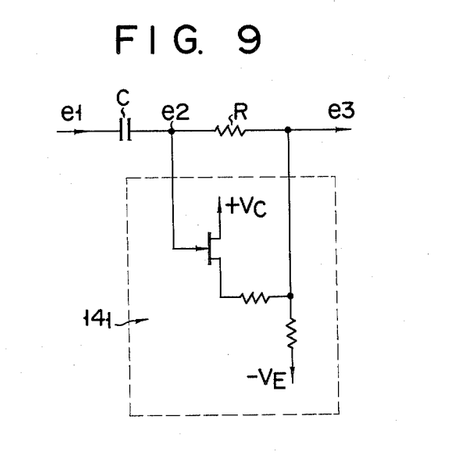
FIGS. 9 and 10 show concrete circuitries of the amplifier $14_1$ shown in FIG. 8.
Figure 10:
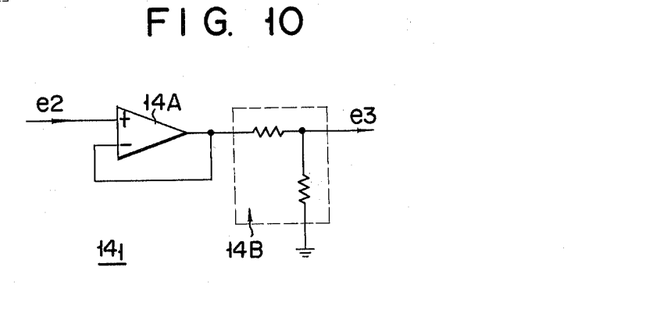

FIG. 9 shows a concrete circuit configuration of the amplifier $14_1$ of FIG. 8. FIG. 10 shows a modification of FIG. 9. In FIG. 9 an FET source follower is used for the amplifier $14_1$. In FIG. 10 a buffer amplifier 14A and a voltage attenuator 14B are used for the amplifier $14_1$.

Although specific constructions have been illustrated and described herein, it is not intended that the invention be limited to the elements, constructions and conditions disclosed. One skilled in the art will recognize that other particular elements, sub-constructions or conditions may be used without departing from the scope and spirit of the invention. For example, the first signal e1 may be a linear function wave, e.g. a sawtooth wave or a ramp wave.

What is claimed is:

1. A reactance measuring device for determining an unknown capacitance comprising:
    signal source means for generating a first voltage signal having a given frequency, a given voltage and a given waveform;
    a capacitance element having said unknown cpacitance and having two ends with one end connected to said signal source means for receiving said first signal;
    a known resistive element coupled between the other end of said capacitive element and a fixed reference potential, said capacitive and resistive elements constituting a differentiation circuit for differentiating said first signal to provide a second signal; and
    measurement means coupled to said differentiation circuit for measuring the value of amplitude of said second signal which is substantially proportional to said unknown capacitance said measurement means including compensation means coupled to said differentiation circuit for compensating non-linearity of the amplitude value of said second signal versus said unknown capacitance so that the relation between the amplitude value of said second signal and said capacitance becomes linear.

2. A reactance measuring device for determining an unknown inductance comprising:
    signal source means for generating a first voltage signal having a given frequency, a given voltage and a given waveform;
    a known resistive element having two ends and connected to said signal source means for receiving at one end said first signal;
    an inductive element having an unknown inductance and coupled between the other end of said known resistive element and a fixed reference potential, said resistive and inductive elements constituting a differentiation circuit for differentiating said first signal to provide a second signal; and
    measurement means coupled to said differentiation circuit for measuring the value of amplitude of said second signal which is substantially proportional to said unknown inductance said measurement means including compensation means coupled to said differentiation circuit for compensating non-linearity of the amplitude value of said second signal versus said unknown inductance so that the relation between the amplitude value of said second signal and said inductance becomes linear.

3. The reactance measuring device of claim 4, wherein said measurement means includes:
    compensation means coupled to said differentiation circuit for compensating non-linearity of the amplitude value of said second signal versus said unknown capacitance so that the relation between the amplitude value of said second signal and said capacitance becomes linear.

4. A reactance measuring device for determining an unknown capacitance comprising:
    signal source means for generating a first voltage signal having a given frequency, a given voltage and a given waveform;
    a capacitive element having an unknown capacitance and having two ends with one end connected to said signal source means for receiving said first signal;
    a known resistive element having two ends and coupled at one end to the other end of said capacitance;
    a non-inverted amplifier coupled at its input terminal to the other end of said capacitive element and coupled at its output terminal to the other end of said resistive element, said capacitive and resistive elements and non-inverted amplifier constituting a differentiation circuit for differentiating said first signal and providing a second signal from the other end of said resistive element; and
    measurement means coupled to said differentiation circuit for measuring the value of amplitude of said second signal which is substantially proportional to said unknown capacitance.

5. The reactance measuring device of claim 4 wherein the gain or amplification degree of said non-inverted amplifier is more than half and less than one.

6. A reactance measuring device for determining an unknown cpacitance comprising:
   signal source means for generating a first voltage signal having a given frequency, a given voltage and a given waveform;
   a capacitance element having said unknown capacitance and having two ends with one end connected to said signal source means for receiving said first signal;
   a known resistive element coupled between the other end of said capacitive element and a fixed reference potential, said cpacitive and resistive elements constituting a differentiation circuit for differentiating said first signal to provide a second signal; and
   measurement means coupled to said differentiation circuit for measuring the value of amplitude of said second signal which is substantially proportional to said unknown capacitance said measurement means including sample/hold means coupled to said differentiation circuit for sampling the peak potential of said second signal and holding the sampled potential of said second signal, the held potential of said second signal being said capacitance.

7. The reactance measuring device of claim 1 wherein said measurement means includes:
   sample/hold means coupled to said differentiation circuit for sampling the peak potential of said second signal and holding the sampled potential of said second signal, the held potential of said second signal being said capacitance.

8. A reactance measuring device for determining an unknown inductance comprising:
   signal source means for generating a first voltage signal having a given frequency, a given voltage and a given waveform;
   a known resistive element having two ends and connected to said signal source means for receiving at one end said first signal;
   an inductive element having an unknown inductance and coupled between the other end of said known resistive element and a fixed reference potential, said resistive and inductive elements constituting a differentiation circuit for differentiating said first signal to provide a second signal; and
   measurement means coupled to said differentiation circuit for measuring the value of amplitude of said second signal which is substantially proportional to said unknown inductance said measurement means including sample/hold means coupled to said differentiation circuit for sampling the peak potential of said second signal and holding the sampled potential of said second signal, the held potential of said second signal being said inductance.

9. The reactance measuring device of claim 2 wherein said measurement means includes:
   sample/hold means coupled to said differentiation circuit for sampling the peak potential of said second signal and holding the sampled potential of said second signal, the held potential of said second signal being said inductance.

10. The reactance measuring device of claim 4 wherein said measurement means includes:
    sample/hold means coupled to said differentiation circuit for sampling the peak potential of said second signal and holding the sampled potential of said second signal, the held potential of said second signal being said capacitance.

11. The reactance meausring device of claim 3 wherein said measurement means includes:
    sample/hold means coupled to said differentiation circuit for sampling the peak potential of said second signal and holding the sampled potential of said second signal, the held potential of said second signal being said capacitance.

12. The reactance measuring device of any one of claims 6 to 11, further comprising:
    means coupled to said sample/hold means for determining the timing of sampling so that the sampling is performed at the tail end portion of the period of said second signal.

* * * * *